(12) United States Patent
Shimosawa

(10) Patent No.: US 7,338,887 B2
(45) Date of Patent: Mar. 4, 2008

(54) PLASMA CONTROL METHOD AND PLASMA CONTROL APPARATUS

(75) Inventor: Makoto Shimosawa, Tokyo (JP)

(73) Assignee: Fuji Electric Holdings Co., Ltd., Kawasaki (JP)

(*) Notice: Subject to any disclaimer, the term of this patent is extended or adjusted under 35 U.S.C. 154(b) by 38 days.

(21) Appl. No.: 11/217,680

(22) Filed: Sep. 2, 2005

(65) Prior Publication Data

US 2006/0110933 A1 May 25, 2006

(30) Foreign Application Priority Data

Nov. 22, 2004 (JP) ............................. 2004-338088

(51) Int. Cl.
*H01L 21/26* (2006.01)
*H01L 21/42* (2006.01)

(52) U.S. Cl. ............... 438/513; 438/680; 257/E21.017; 257/E21.219; 257/E21.218

(58) Field of Classification Search ................ 438/513, 438/913, 680, 689, 659, 663, 729, 772, 777, 438/7, 8
See application file for complete search history.

(56) References Cited

U.S. PATENT DOCUMENTS

| | | | | |
|---|---|---|---|---|
| 4,464,223 A | * | 8/1984 | Gorin | ........................ 438/729 |
| 4,496,448 A | * | 1/1985 | Tai et al. | ............... 204/192.32 |
| 4,585,516 A | * | 4/1986 | Corn et al. | ................. 438/714 |
| 4,602,981 A | * | 7/1986 | Chen et al. | .................... 438/17 |
| 4,622,094 A | * | 11/1986 | Otsubo | ........................ 216/61 |
| 5,415,718 A | * | 5/1995 | Ohmi et al. | ........... 156/345.26 |
| 2001/0021422 A1 | | 9/2001 | Yamakoshi | |
| 2002/0159216 A1 | | 10/2002 | Ennis | |
| 2002/0186018 A1 | | 12/2002 | Sill et al. | |

FOREIGN PATENT DOCUMENTS

| | | |
|---|---|---|
| JP | 2000-164520 | 6/2000 |
| JP | 2001-257098 | 9/2001 |
| JP | 2002-313743 | 10/2002 |
| JP | 2004-253417 | 9/2004 |

* cited by examiner

*Primary Examiner*—David Nhu
(74) *Attorney, Agent, or Firm*—Rabin & Berdo, P.C.

(57) ABSTRACT

A method that controls the distribution of plasma generated in a vacuum chamber, for example, as part of a plasma thin film deposition or plasma etching process. For thin film deposition, the method serves to minimize variations in film thickness caused by the variations of the film deposition conditions. The vacuum chamber includes a high-frequency-wave electrode connected to a high-frequency electric power supply and an earth electrode connected to ground potential. High frequency-electric power is fed to the high-frequency-wave electrode and peak-to peak voltages are measured at multiple measuring points on one of the two electrodes. The distribution of the plasma is controlled by adjusting the chamber pressure to minimize the differences between the measured peak-to-peak voltages.

7 Claims, 13 Drawing Sheets

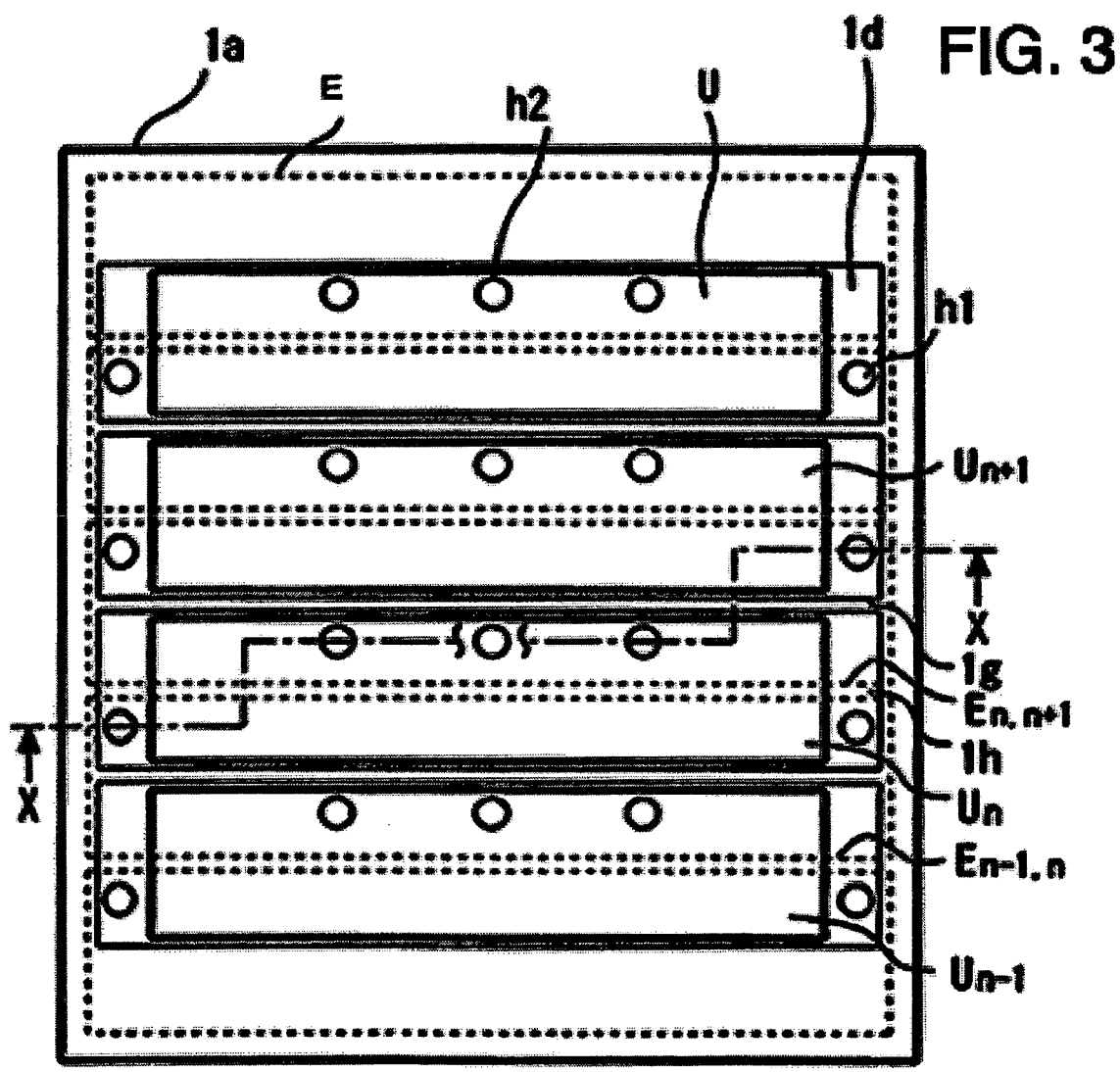

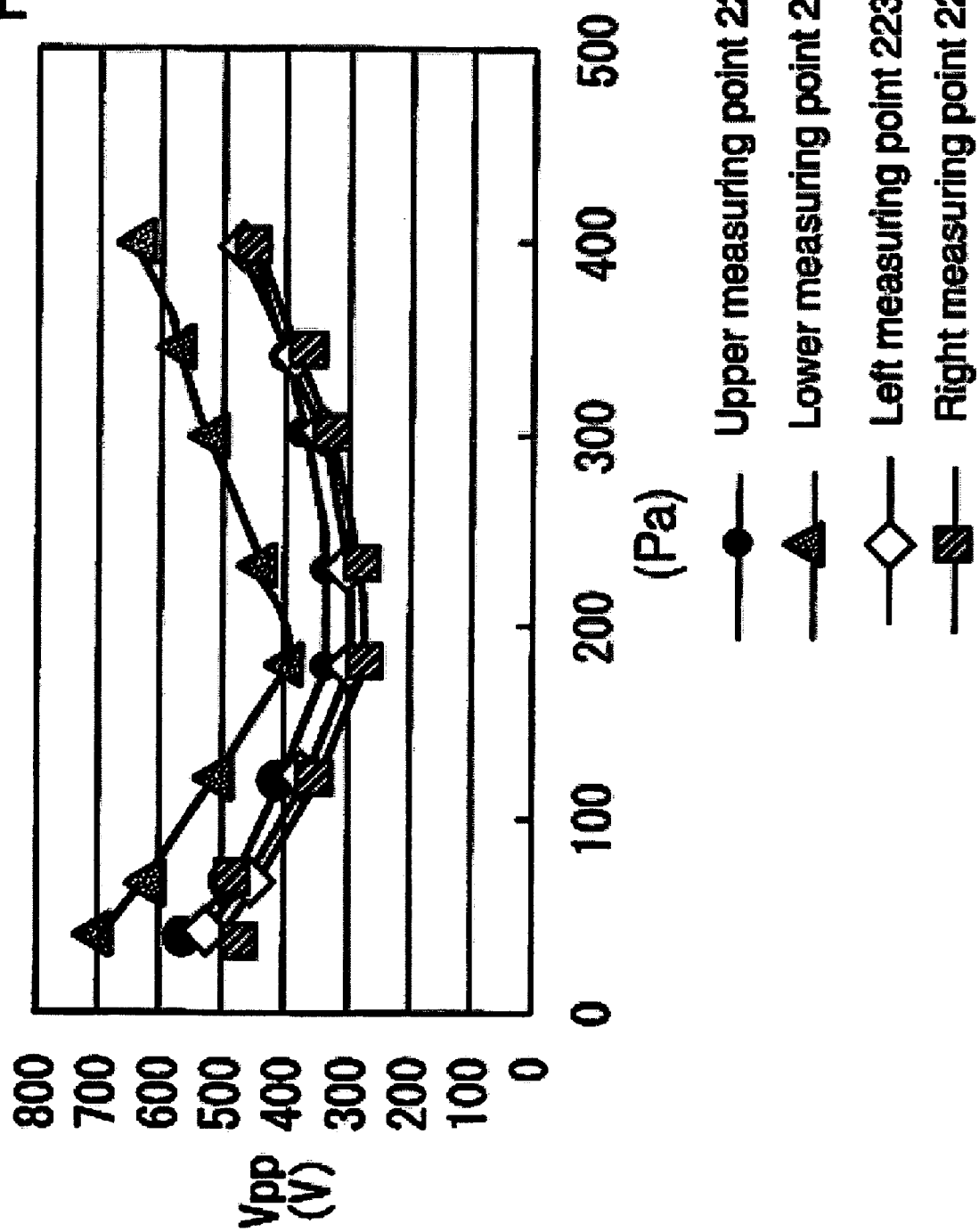

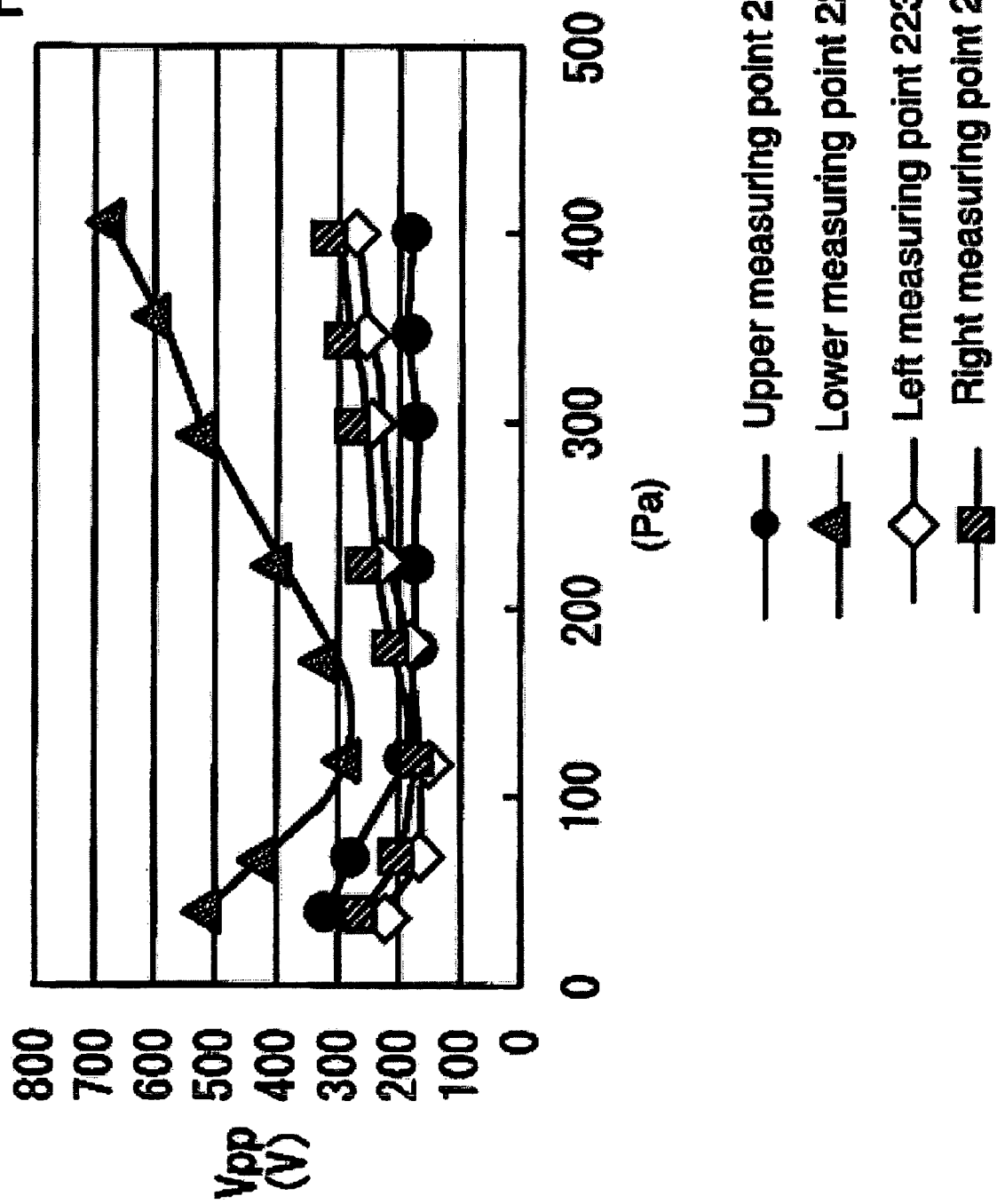

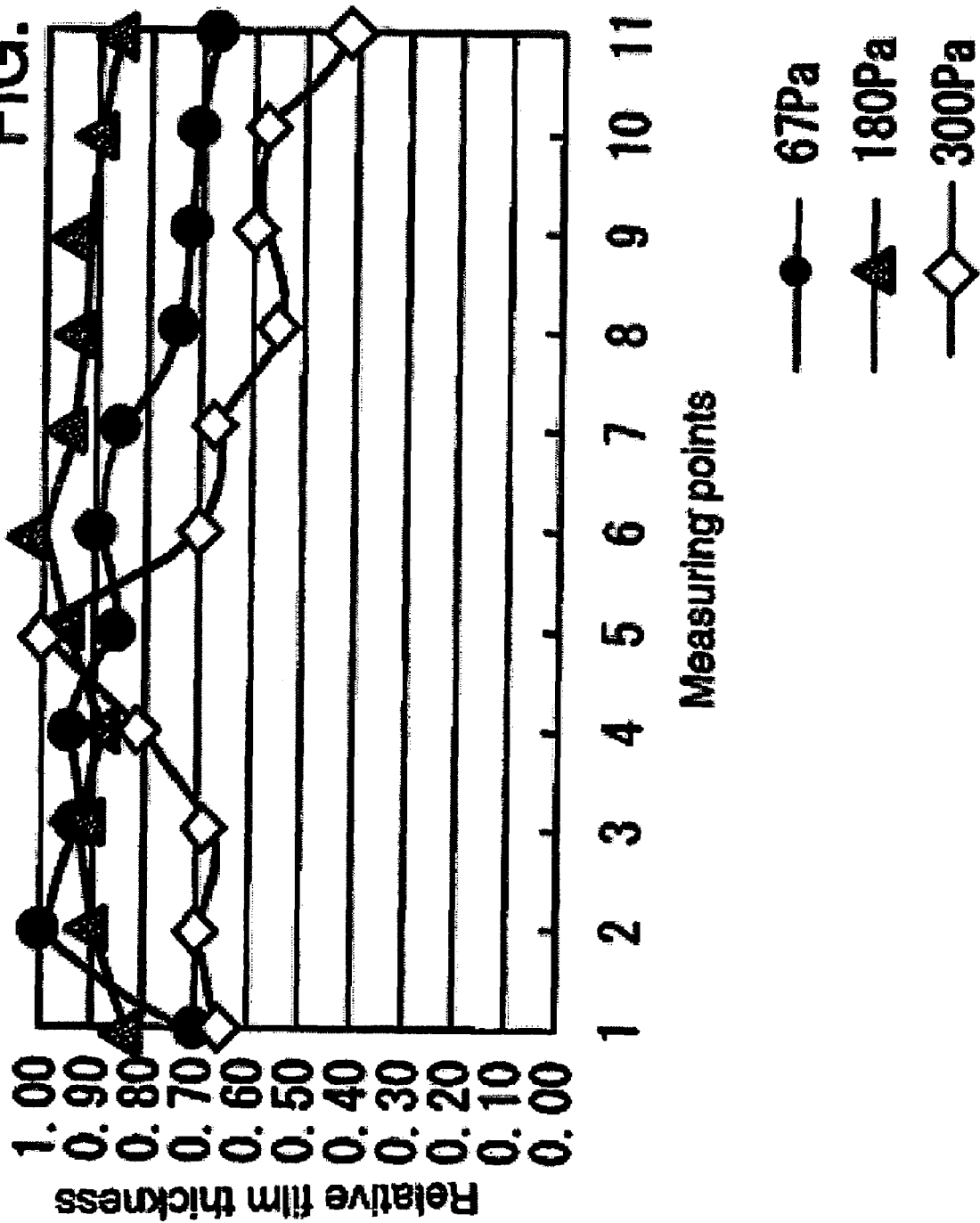

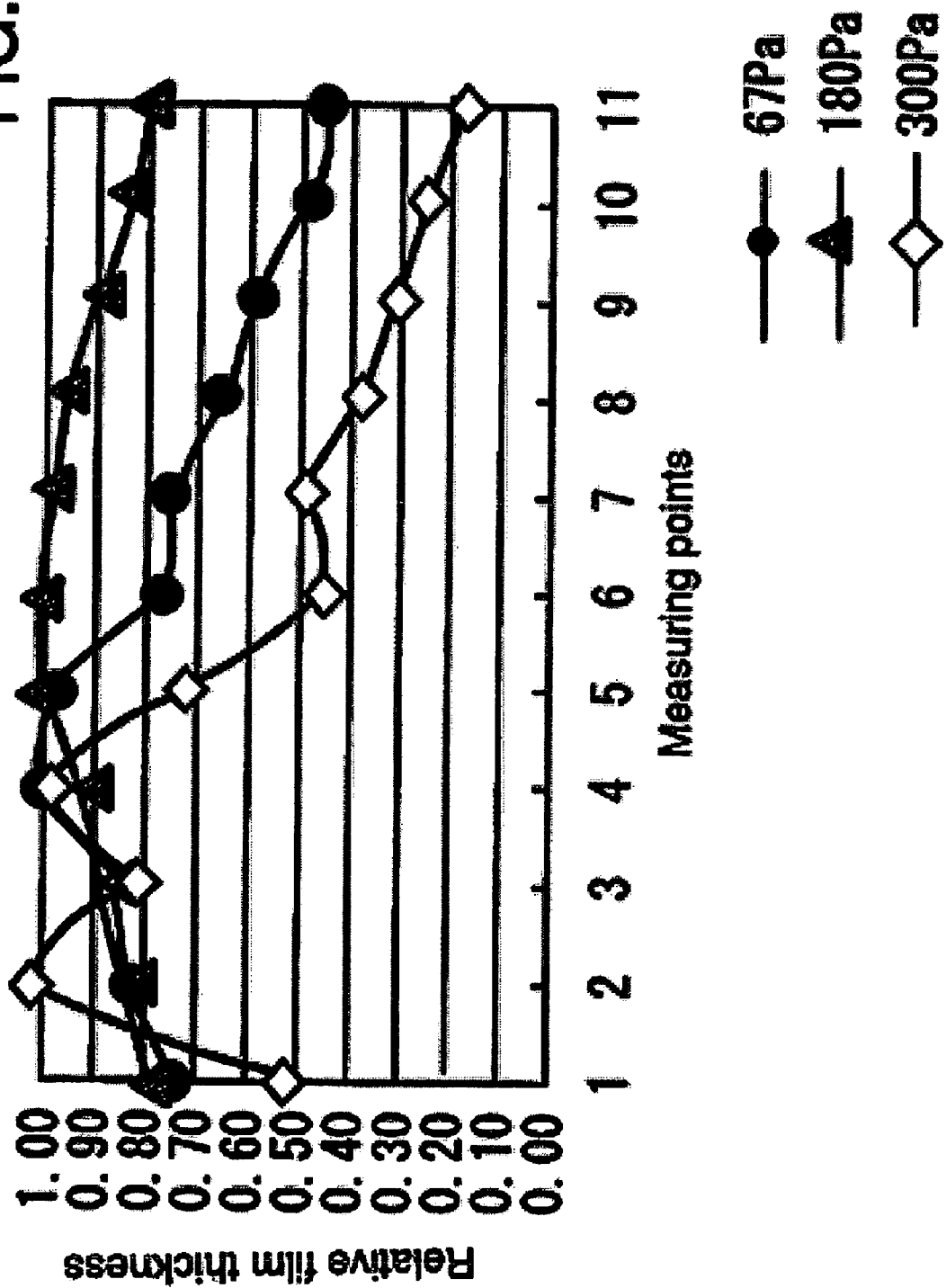

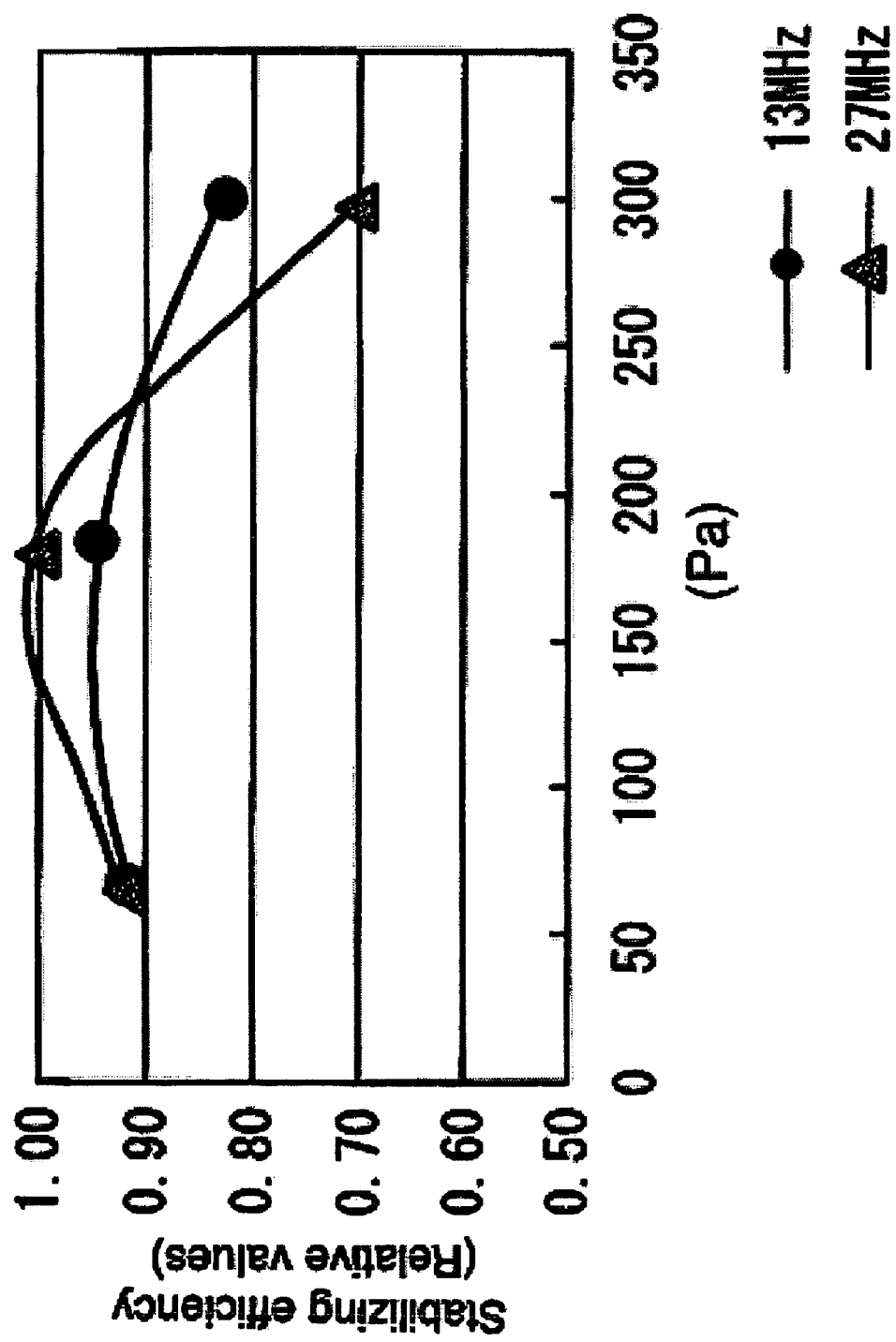

US 7,338,887 B2

PLASMA CONTROL METHOD AND PLASMA CONTROL APPARATUS

CROSS-REFERENCE TO RELATED APPLICATION

This application claims the foreign priority benefit of applicant's Japanese application serial no. JP-2004-338088, the disclosure of which is incorporated herein by reference.

FIELD OF THE INVENTION

The invention relates to a plasma control method for controlling the distribution of a generated plasma. Specifically, the invention relates to a plasma control method for controlling the distribution of the plasma generated by high-frequency electric power fed to a high-frequency-wave electrode in a vacuum chamber. The method is part of a process of plasma thin film deposition, wherein the high-frequency-wave electrode is connected to a high-frequency electric power supply and an earth electrode faces the high-frequency-wave electrode and is connected to the ground potential or a predetermined other electric power supply.

BACKGROUND OF THE INVENTION

Thin film deposition using a plasma and etching using a plasma have been employed in many technical fields. A capacitive-coupling-type plane-parallel-plate plasma-enhanced chemical vapor deposition apparatus (hereinafter referred to simply as a "PECVD apparatus") and a plasma etching apparatus have been used for plasma thin film deposition and for plasma etching. A thin film is deposited by making $SiH_4$ (silane) and such a gas for film deposition (or a gas for film formation: hereinafter referred to as a "film deposition gas") flows into a vacuum chamber in any of the apparatuses described above. Etching is performed by making $CF_4$ (fluoride gas), and causing such an etching gas to flow into a vacuum chamber in any of the apparatuses described above.

Now, with reference to FIG. 12, the manufacture of a thin film solar cell by the plasma-enhanced CVD method will be described by way of example in connection with the formation of a thin film containing silicon as the main component thereof (hereinafter referred to simply as a "Si thin film") using a film deposition gas containing $SiH_4$ as the main component thereof. FIG. 12 is a cross-sectional view schematically showing a conventional PECVD apparatus.

Referring to FIG. 12, the conventional PECVD apparatus includes a vacuum chamber 201; a high-frequency-wave electrode 210 positioned in vacuum chamber 201 and connected to high-frequency electric power fed from a high-frequency electric power supply (RF) 205, and an earth electrode 211 positioned in vacuum chamber 201 and connected to the ground potential. It is not always necessary to connect earth electrode 211 to the ground potential. Earth electrode 211 may include a mechanism for feeding DC electric power or high-frequency electric power thereto depending on the purposes thereof. Earth electrode 211 includes a mechanism for positioning a substrate 212 thereon and a heating mechanism (hereinafter referred to as a "heater") 204 therein for heating substrate 212. Without difficulty, substrate 212 may be positioned at an arbitrary position in vacuum chamber 201 such as on high-frequency-wave electrode 210. Heater 204 may be positioned at an arbitrary position in vacuum chamber 201 or omitted from the CVD apparatus.

A thin film is deposited by the following steps. First, the inside of vacuum chamber 201 is evacuated to certain degrees of vacuum through an exhaust system (an exhaust line 203 such as a vacuum pump and an exhaust pump). Then, substrate 212 is heated with heater 204, if necessary. Immediately after vacuum chamber 201 is evacuated, moisture and such other impurities are absorbed very often by the inner surface of vacuum chamber 201 and the surface of substrate 212. If a thin film is deposited in the state in which these impurities are not sufficiently degassed, a large amount of impurities are contained in the thin film, impairing the film quality. To facilitate degassing the inside of vacuum chamber 201, a gas is sent into vacuum chamber 201 through a gas feeder line 202 and the inside of vacuum chamber 201 is heated (baked) in the state in which the inside of vacuum chamber 201 is kept at the predetermined degrees of vacuum by a not shown pressure controller and gas exhaust line 203. A gas such as $H_2$ that exhibits a relatively high thermal conductivity, an inert gas such as He and Ar, and a film deposition gas made to flow for film deposition are employed for the gas that is made to flow during the baking performed in the vacuum chamber. The temperature of substrate 212 during the baking is set sometimes to be higher than the temperature of substrate 212 during the actual film deposition to facilitate degassing and to reduce the amount of degassing during film deposition.

After the degassing is completed, substrate 212 is set at the temperature at which film deposition is performed. The inside of vacuum chamber 201 is kept under an appropriate pressure by flowing a gas mixture containing several kinds of film deposition gases mixed at an appropriate mixing ratio depending on the films to be deposited. Then, a thin film is deposited on substrate 212 with a plasma 206 generated between high-frequency-wave electrode 210 and earth electrode 211 by feeding electric power to high-frequency-wave electrode 210. Plasma 206 is generally called a "low-temperature plasma".

The selections of the conditions for the film deposition described above are very important for determining the thin film quality, the film deposition speed, and the film thickness uniformity in the effective film deposition area. The film deposition conditions include hardware configuration conditions such as the spacing between high-frequency-wave electrode 210 and earth electrode 211 (hereinafter referred to as the "electrode spacing") and the frequency of high-frequency electric power supply 205. The conditions of film deposition for depositing a silicon thin film include the hydrogen dilution rate that is a flow rate ratio of a film deposition gas $SiH_4$ and a diluent gas $H_2$, the temperature of substrate 212, the pressure at which film deposition is performed, the frequency of high-frequency electric power supply 205, the level of supplied electric power, and the spacing between high-frequency-wave electrode 210 and earth electrode 211. These conditions affect each other in determining the thin film properties.

Japanese patent publication JP P 2004-253417 A describes one way of selecting the film deposition conditions. According to that publication, a photoelectric converter device exhibiting excellent photoelectric conversion characteristics is obtained by depositing a photoelectric converter layer at the hydrogen amount ratio ($SiH_2/SiH$), which is a ratio of the amount of hydrogen in the $SiH_2$ bondings to the amount of hydrogen in the SiH bondings in the photoelectric converter layer, set at 0.3 or smaller and at the peak-to-peak voltage Vpp, which is the average value of the high-frequency voltages applied between the electrodes, set at 300 V or lower (cf. FIGS. 3 and 5 and the descriptions with reference thereto in the Japanese patent publication JP P 2004-253417 A). Japanese patent publication JP P 2004-253417 A describes also the existence of a strong correlation between the peak-to-peak voltage Vpp and the photoelectric conversion characteristics, and that a photoelectric converter device exhibiting better photoelectric conversion characteristics is obtained at a lower peak-to-peak voltage Vpp (preferably Vpp≦200 V).

Japanese patent publications JP P 2000-164520 A, JP, P 2001-257098 A, and JP P 2002-313743 A describe means for improving the thickness uniformity in the effective film plane. The means described in Japanese patent publication JP P 2000-164520 A includes high-voltage variable capacitors disposed on the high-frequency-electric-power-supply side of a high-frequency-wave electrode for generating a plasma and on the opposite side thereof. The improvement in film thickness uniformity described in Japanese patent publication JP P 2000-164520 A makes the plasma potential uniform in film deposition by changing the high-frequency-wave phase using the high-voltage variable capacitors. In Japanese patent publication JP P 2001-257098 A, the voltage distribution in the discharging electrode is changed by changing the phase and/or the difference in phase between multiple feeding points of the high-frequency electric power with time. In Japanese patent publication JP P 2002-313743 A, the variations in the film thickness are reduced by making the phases of a high-frequency voltage different on the adjacent small electrodes. Each of these four Japanese patent publications employs a technique for making the plasma distribution uniform, which exhibits a correlation with the film thickness uniformity by changing the apparatus configurations for film deposition.

Although the peak-to-peak voltage Vpp has been one of the film deposition conditions to be selected, few have proposed and described the use of the peak-to-peak voltage Vpp for improving the film thickness uniformity. Japanese patent publication JP P 2004-253417 A describes embodiments that apply the power supply frequencies of 13.56 MHz and 27.12 MHz for manufacturing a solar cell on a film substrate having a film deposition area of 40 cm×80 cm. However, the wavelength of the electric power supply frequency and the size of the electrode become almost the same when the electrode area is widened to be on the level of 1 m×1 m or when the power supply frequency is raised. As the wavelength of the electric power supply frequency and the electrode size approach each other, the uniformity of the film thickness in the effective film plane may be impaired.

The conventional means for increasing the film thickness uniformity do so by improving the apparatus configurations for film deposition related, for example, to the electric power supply scheme. Therefore, no attention has been paid to the measurable quantities related to the change in uniformity of film thickness caused by a change in the conditions of film deposition.

Means are known for measuring the plasma distribution exhibiting a correlation with the uniformity of film thickness. For example, a probe method that inserts a probe into a plasma for measuring the plasma distribution, or a spectroscopic method may be used. However, the probe method causes large errors in the atmosphere of the film deposition. The spectroscopic measurement requires a large-scale measuring system for measuring the uniformity of film thickness over a wide area. Therefore, the conventional means for measuring the plasma distribution exhibit respective limitations in measuring the plasma distribution uniformity over a wide area. It has been difficult to apply any of the conventional means for measuring the plasma distribution to a manufacturing apparatus in practical use on a production line except for a manufacturing apparatus that is actually designed with a means for measuring the plasma distribution taken into consideration. When the apparatus is designed in consideration of the plasma measurement, the manufacturing costs of the apparatus soar.

When the peak-to-peak voltage Vpp on the high-frequency-wave electrodes is considered, the absolute value of the peak-to-peak voltage Vpp and the distribution of the peak-to-peak voltage Vpp are different, not only from lot to lot but also between the early stage and the late stage of lot manufacture. Since manual cleaning is performed for every lot, the variations are caused in the peak-to-peak voltage Vpp and the absolute value thereof at the time when the manual cleaning is performed. It is considered that the variations of the peak-to-peak voltage Vpp and the absolute value thereof, as between the early stage and the late stage of lot manufacture, are due to the increasing amount of powder on the wall of the film deposition room with repeated film deposition operations.

In view of the foregoing, it would be desirable to obviate the problems described above. In detail, it is a first object of the invention to provide a plasma control method that facilitates obtaining relatively simply and easily a means (guideline) for increasing the film thickness uniformity in consideration of the measurable quantities related to change in the film thickness uniformity caused by the changes in the conditions of film deposition.

It is a second object of the invention to provide a plasma control method that facilitates reduction of measurement errors, not with a large-scale measuring system, but with a low-cost control apparatus.

A third object of the invention is to provide a plasma control method that facilitates obtaining very uniform film characteristics and improving the throughput of manufacture, in response to several variations in characteristics. The variations would include, for example, the absolute value and distribution of the peak-to-peak voltage Vpp from lot to lot, and characteristics that depend on the time of lot manufacture, for example, whether it is an early stage of lot manufacture or a late stage of lot manufacture.

A fourth object of the invention is to provide a plasma control method that does not impair the uniformity of thickness in the film plane. The thickness in the film plane should be uniform even when the electrode area is widened to be on the level of 1 m×1 m or the power supply frequency is raised.

SUMMARY OF THE INVENTION

According to a first aspect of the invention, a plasma control method controls the distribution of a plasma generated in a vacuum chamber. The vacuum chamber includes a first electrode connected to a high-frequency electric power supply and a second electrode facing to the first electrode. The second electrode is connected to ground potential or to a predetermined electric power supply. The plasma is generated by high-frequency electric power fed to the first electrode. The method includes a control step in which the distribution of the plasma is controlled based on the peak-to-peak voltages measured at multiple points on the first electrode and/or on the second electrode with a peak-to-peak voltage measuring device disposed at the multiple points.

Advantageously, in the control step, the distribution of the plasma generated is controlled, preferably by an automatic control means, so that the peak-to-peak voltages measured at the multiple points are nearly the same. Advantageously, the pressure in the vacuum chamber is controlled, preferably by the automatic control means, so that the peak-to-peak voltages measured at the multiple points are nearly the same.

Advantageously, the method further includes depositing a thin film on a substrate, positioned on the first electrode or on the second electrode, under predetermined conditions of film deposition using the plasma, the distribution of which is controlled in the control step, and a film deposition gas is made to flow onto the substrate in the vacuum chamber.

Advantageously, the predetermined conditions of film deposition include the ratio of the amount of hydrogen in $SiH_2$ bondings to the amount of hydrogen in SiH bondings ($SiH_2/SiH$) in a non-crystalline photoelectric converter layer selected to be 0.3 or smaller, and the peak-to-peak voltages measured at the multiple points are selected to be 300 V or lower to manufacture a solar cell including the non-crystalline photoelectric converter layer.

Advantageously, the method further includes etching the substrate positioned on the first electrode or on the second electrode, using the plasma, wherein the distribution thereof is controlled in the control step, and an etching gas is made to flow onto the substrate in the vacuum chamber. According to a second aspect of the invention, a plasma control apparatus is provided that controls the distribution of a plasma generated using any of the plasma control methods according to the invention. By the plasma control method according to the invention, peak-to-peak voltages Vpp are measured at multiple measuring points on a high-frequency-wave electrode prior to forming a photoelectric converter device in practice in manufacturing a thin film silicon solar cell by depositing a thin film of amorphous silicon or micro-crystalline silicon on a flexible substrate positioned in a PECVD apparatus. Even when the peak-to-peak voltages Vpp are measured at multiple measuring points on the high-frequency-wave electrode, the peak-to-peak voltages Vpp are measured with a measuring device disposed easily with low costs. Since the distribution of the peak-to-peak voltage Vpp exhibits a certain correlation with the potential distribution on the high-frequency-wave electrode and a certain correlation with the plasma distribution, excellent film thickness uniformity is obtained by monitoring the distribution of the peak-to-peak voltage Vpp on the high-frequency-wave electrode and selecting the film deposition conditions so that the peak-to-peak voltages Vpp on the high-frequency-wave electrode may be nearly the same. In other words, a relatively simple and easy means (guideline) for increasing the film thickness uniformity, which employs the distribution of the peak-to-peak voltage Vpp on the high-frequency-wave electrode as a measurable quantity related with the change of the film thickness uniformity caused by the change of the film deposition conditions, is obtained and the film deposition conditions are optimized simply and easily. The peak-to-peak voltages Vpp on the high-frequency-wave electrode are measured relatively easily with small measurement errors and with low costs without using any large-scale measuring device. By using the monitored peak-to-peak voltage Vpp for the other control mechanisms for controlling the other film deposition conditions, such as a pressure control mechanism, and by controlling the other film deposition conditions based on the monitoring results, excellent film thickness uniformity is obtained simply and easily in response to the variations of the absolute values and the distributions of the peak-to-peak voltages Vpp from lot to lot and in response to the variations that depend on the time of lot manufacture such as the early stage of lot manufacture and the late stage of lot manufacture, and the throughput of product manufacture is improved. Since plasma uniformity is important for etching using a plasma, and affects the uniformity of the etching, the plasma control method according to the invention also is effective for plasma etching control.

BRIEF DESCRIPTION OF THE DRAWINGS

FIG. 3 is a top plan view of a solar cell having a back electrode on the back surface (the opposite major surface opposite to the solar cell) of the substrate.

FIG. 5 shows a set of curves relating the peak-to-peak voltage Vpp with the film deposition pressure, with the frequency of the high-frequency-wave electrode set at 13 MHz.

FIG. 6 shows a set of curves relating the peak-to-peak voltage Vpp with the film deposition pressure, with the frequency of the high-frequency-wave electrode set at 27 MHz.

FIG. 7 shows a set of curves illustrating the thickness distributions of the i-layer deposited under different film deposition pressures, with the high-frequency electric power supply frequency set at 13 MHz.

FIG. 8 shows a set of curves describing the thickness distributions of the i-layer deposited under different film deposition pressures, with the high-frequency electric power supply frequency set at 27 MHz.

FIG. 9 shows a couple of curves describing the characteristics of the solar cells manufactured by the plasma control method according to the first embodiment of the invention.

DETAILED DESCRIPTION OF THE PREFERRED EMBODIMENTS

Now the invention will be described below in detail with reference to the accompanied drawing figures, which illustrate the preferred embodiments of the invention.

First Embodiment

According to the plasma control method of a first embodiment of the invention, a thin film silicon solar cell is manufactured by depositing a silicon thin film such as an amorphous silicon thin film (hereinafter referred to as an "a-Si thin film") and a micro-crystalline silicon thin film (hereinafter referred to as a "μc-Si thin film") in a PECVD apparatus. The electrode is 1 m×1 m in area. A power supply (high-frequency electric power supply), the frequency of which is set at 13 MHz or 27 MHz, is connected to a high-frequency-wave electrode (first electrode), and an earth electrode (second electrode) is grounded. The high-frequency electric power supply is connected to the high-frequency-wave electrode at multiple power supply points intentionally positioned thereon to obtain a uniform potential distribution or to obtain a uniform plasma distribution over the high-frequency-wave electrode. Although the electrodes are shaped with a plate, a ladder-shaped electrode may be used without problem. It is not always necessary to bias the earth electrode at the ground potential. Alternatively, the earth electrode may include a power supply means for supplying high-frequency electric power or DC electric power without problem. A shower electrode is employed for the high-frequency-wave electrode and gases are fed from the side of the high-frequency-wave electrode. The manner of gas feed is not limited to the scheme described above. Although a film substrate is used according to the first embodiment, a glass substrate or a stainless steel substrate may be used alternatively.

Figure 1:
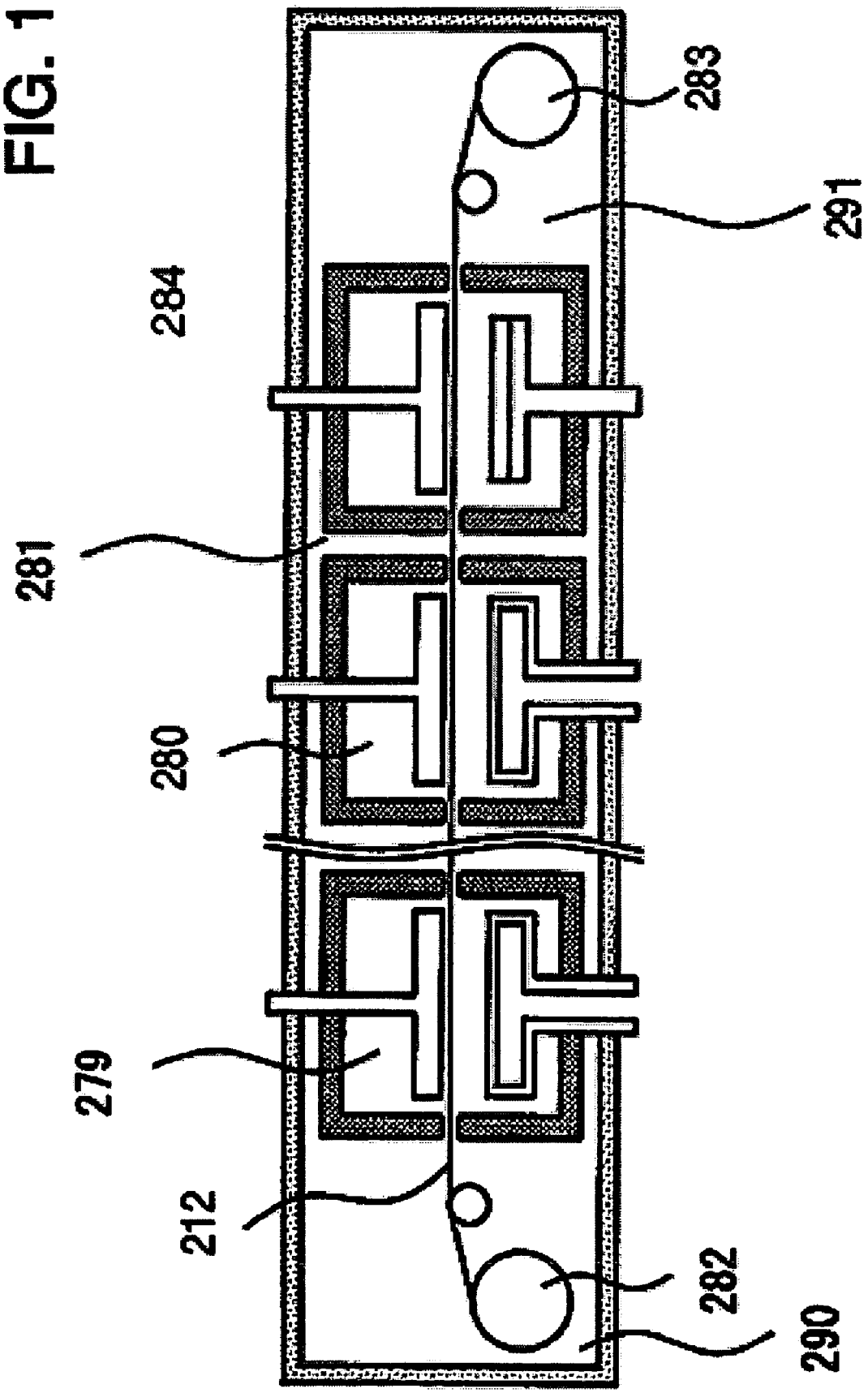
FIG. 1 is a cross-sectional view of entire installations including a PECVD apparatus according to a first embodiment of the invention.

FIG. 1 is a cross-sectional view of entire installations including a PECVD apparatus (or a plasma control apparatus) according to the first embodiment of the invention. Referring to FIG. 1, the PECVD apparatus has a structure that facilitates depositing films by the stepping roll scheme. In FIG. 1, shown are an unwinder room 290 for unwinding a flexible substrate 212; a plurality of film deposition rooms 280 (only one shown in the drawing), which are independent treatment spaces for depositing a metal electrode layer, a photoelectric converter layer or a transparent electrode layer on flexible substrate 212; a preheating room 279 positioned between unwinder room 290 and film deposition rooms 280; a winder room 291 for winding flexible substrate 212; and a common room 281 housing preheating room 279 and the film deposition room(s) 280. Although only one film deposition room 280 is shown in FIG. 1 for the sake of drawing convenience, the PECVD apparatus according to the invention may include multiple film deposition rooms as noted above or similar rooms as described below.

Figure 12:
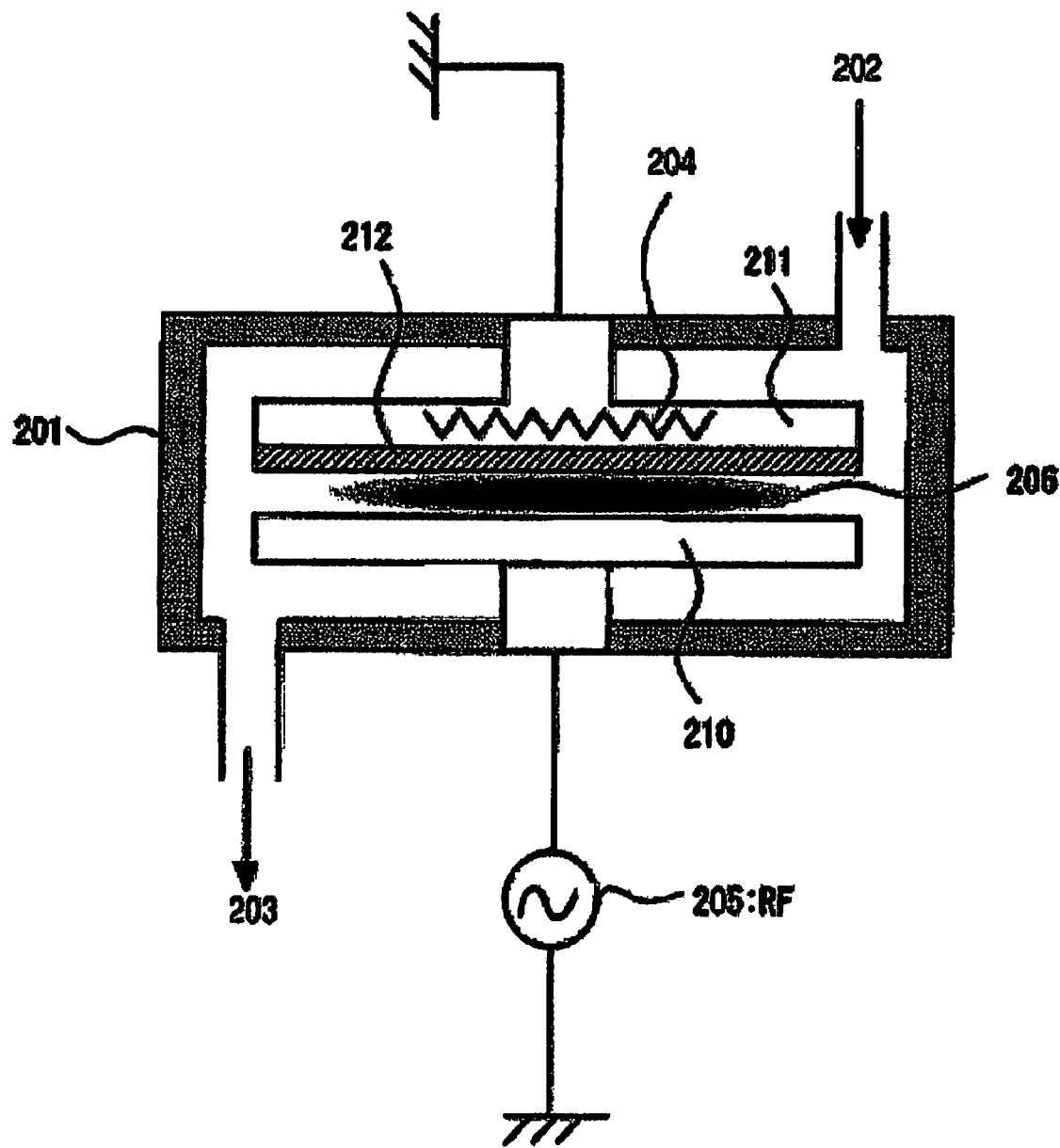
FIG. 12 is a cross-sectional view schematically showing a conventional PECVD apparatus.

Preheating room 279 includes a heater for heating flexible substrate 212 prior to depositing a thin film photoelectric converter layer on flexible substrate 212, a gas feeder line, an exhaust line, and an adjusting mechanism for adjusting the gas pressures. The heater, the gas feeder line, the exhaust line and the gas pressure adjusting mechanism are not shown in FIG. 1. Flexible substrate 212 is unwound off a core 282 and preheated in preheating room 279. After the preheating, constituent thin films are deposited on flexible substrate 212 in the respective film deposition rooms 280 and, then, flexible substrate 212 with the constituent thin films deposited thereon is wound onto a core 283. Since the internal structure of one film deposition room 280 is the same with the internal structure of the PECVD apparatus shown in FIG. 12, a description thereof is omitted for the sake of brevity. The same reference numerals as used in FIG. 12 are used to designate the same constituent elements below.

Although PECVD is used usually for forming the constituent thin films, other methods such as sputtering, vapor deposition, cat-CVD (catalytic CVD), and photo-CVD may be used alternatively. Therefore, an additional room 284 is optionally provided in this embodiment for such a process. A stainless steel foil substrate or other electrically conductive substrate, a Polyimide substrate, a Polyethylene Naphtahalate (PEN) substrate, Polyether Sulfone (PES) substrate, or a Polyethylene Terephtalate (PET) substrate or other heat-resistive plastic substrate may be used for flexible substrate 212. If not limited to a flexible one, a stainless steel substrate or a glass substrate may be used. A nip-type single cell, formed of a substrate, an n-type layer formed on the substrate, an i-layer formed on the n-type layer, a p-type layer formed on the i-layer, and an ITO (indium tin oxide) layer on the p-type layer, is manufactured for a photoelectric converter device.

Figure 2:
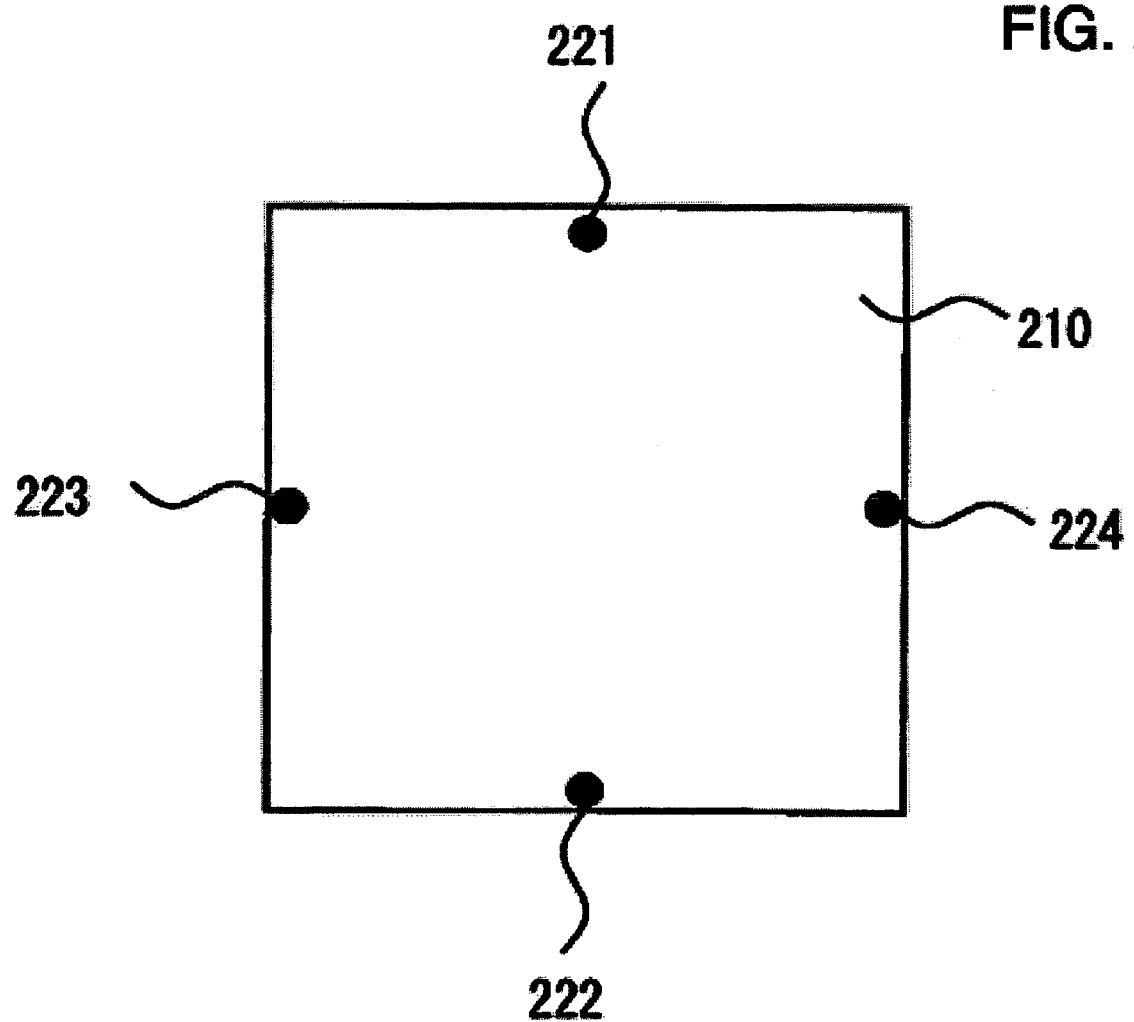
FIG. 2 is a top plan view of a high-frequency-wave electrode showing the measuring points set for measuring the peak-to-peak voltages thereon.

According to the first embodiment, the peak-to-peak voltage Vpp is measured at four measuring points on high-frequency-wave electrode 210 in the i-layer deposition room. FIG. 2 is a top plan view of high-frequency-wave electrode 210 showing the measuring points. Referring to FIG. 2, the four measuring points are a measuring point 221 (the upper measuring point), a measuring point 222 (the lower measuring point), a measuring point 223 (the left measuring point), and a measuring point 224 (the right measuring point). The peak-to-peak voltages Vpp are measured at the measuring points, 221, 222, 223, and 224.

Figure 13:
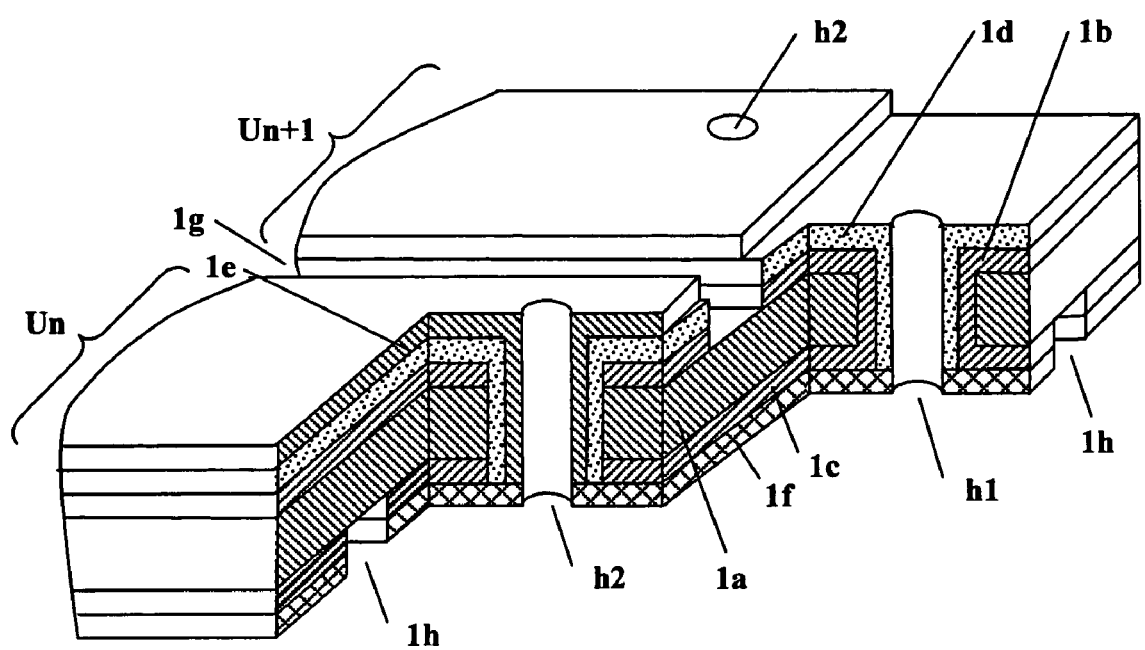
FIG. 13 is a perspective view of a cut plane of a solar cell formed according to the first embodiment of the invention.

Now a method of manufacturing a solar cell will be described in detail below. A pin-type a-Si solar cell, having a power generation area of 1 $m^2$ and a series structure called a "series connection through apertures formed on film (SCAF) structure" (cf. Japanese patent publications JP P Hei. 6 (1994) 342924 A and JP P Hei. 8 (1996) 340125 A), is manufactured. FIG. 3 is a top plan view of a solar cell having a back electrode E on the back surface (the opposite major surface opposite to the solar cell). FIGS. 4A through 4G are cross-sectional views along line X-X of FIG. 3 illustrating the manufacturing steps for manufacturing the solar cell described above. Referring now to these drawing figures, two electrode layers (a first electrode layer 1b and a third electrode layer 1e) are deposited on one major surface of a substrate 1a (flexible substrate 212) such as a plastic substrate with a photoelectric converter layer 1d interposed between the first and third electrode layers 1b and 1e. Two other electrode layers (back electrode E consisting of a second electrode layer 1c and a fourth electrode layer 1f) are deposited on the other major surface (back surface) of substrate 1a. Electrode layers 1b, 1e and photoelectric converter layer 1d on substrate 1a are divided by patterning lines (cutting sections 1g) into unit cells $U_{n-1}$, $U_n$, $U_{n+1}$, which are connected in series to each other. As shown in FIG. 3, unit cell $U_n$ is cut out by cutting sections 1g such that unit cell $U_n$ includes collector holes h2 and third electrode layer 1e on the major surface of substrate 1a is connected electrically to second electrode layer 1c and fourth electrode layer 1f (back electrode E) on the back surface of substrate 1a only in collector holes h2. Back electrode E for unit cell $U_n$ is cut out by cutting sections 1h such that connection holes h1 for unit cell $U_n$ and collector holes h2 for unit cell $U_{n-1}$ belong to back electrode E. Third electrode layer 1e for unit cell $U_n$ and back electrode E are connected electrically to each other in connection holes h1. Therefore, adjacent back electrodes $E_{n-1,n}$ and $E_{n,n+1}$, adjacent to each other and adjacent to an arbitrary unit cell $U_n$, are connected in series via the unit cell $U_n$ such that multiple series connections of unit cell $U_n$ and back electrode E are connected in series, forming a solar cell. FIG. 13 is a perspective view of the solar cell formed as described above including a zigzag cross section for illustrating the relations between the electrode layers and the unit cells connected in multi-series. In FIG. 13, cutting section 1g and cutting section 1h are exaggerated to clearly illustrate the connections between the electrode layers.

Figure 4A:
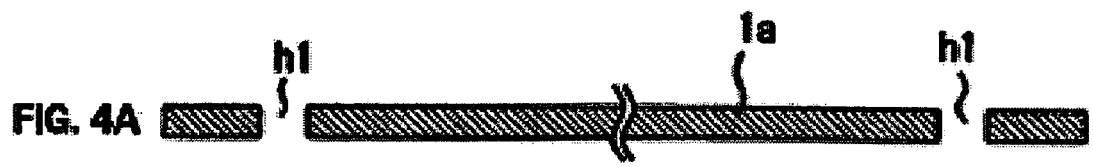
FIGS. 4A through 4G are cross-sectional views along line X-X of FIG. 3 showing the manufacturing steps for manufacturing the solar cell shown in FIG. 3.
Figure 4B:
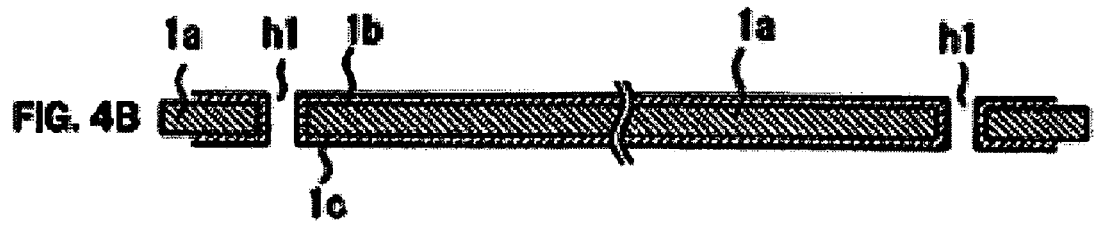
Figure 4C:
Figure 4D:
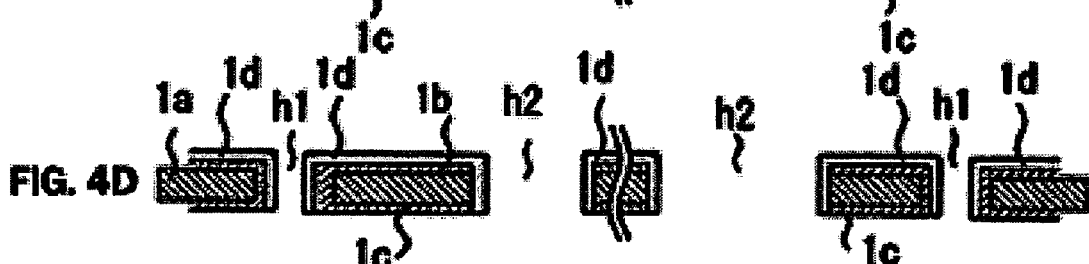
Figure 4E:
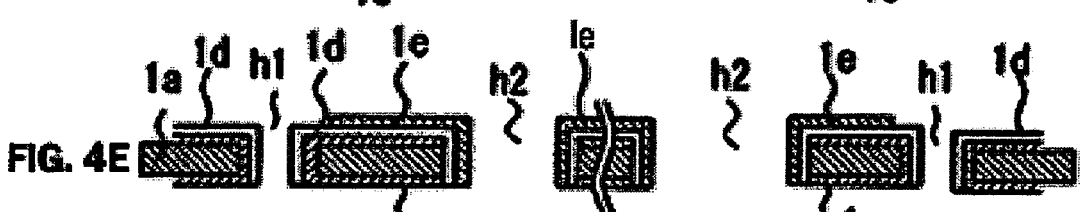
Figure 4F:
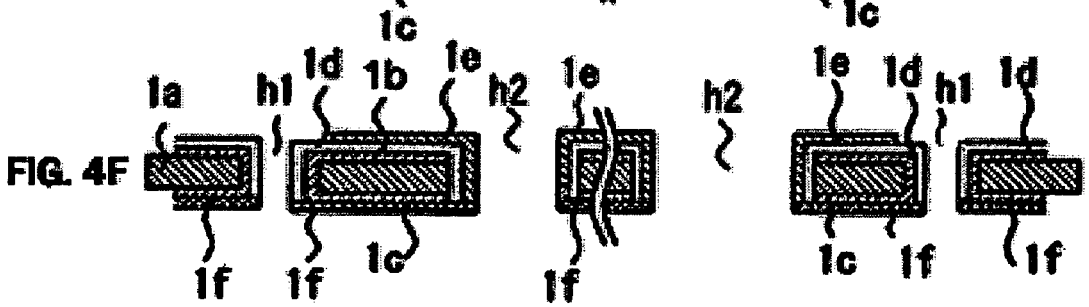
Figure 4G:
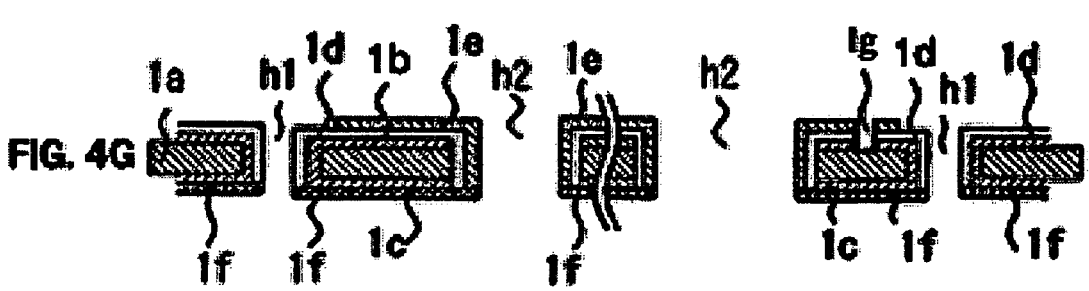

Now the manufacturing steps for manufacturing the above-described solar cell will be described below with reference to FIGS. 4A through 4G, which are cross-sectional views along X-X of FIG. 3. FIG. 4A illustrates the step of forming connection holes. FIG. 4B illustrates the step of depositing a first electrode layer and a second electrode layer. FIG. 4C illustrates the step of forming collector holes. FIG. 4D illustrates the step of depositing a photoelectric converter layer. FIG. 4E illustrates the step of depositing a third electrode layer. FIG. 4F illustrates the step of depositing a fourth electrode layer. FIG. 4G illustrates the step of forming a cutting section. In FIGS. 4A through 4G, the reference letters used for designating the manufacturing steps also are used, but in capitalized form, for designating the corresponding drawing figures.

Referring to FIG. 4A, connection holes h1 are bored at predetermined positions in substrate 1a (step (a)). Connection hole h1 is about 1 mm in diameter. Referring to FIG. 4B, a first electrode layer 1b is deposited on one surface (hereinafter referred to as a "front surface") of substrate 1a, Then, a second electrode layer 1c is deposited on the back surface of substrate 1a facing opposite to the front surface. Second electrode layer 1c may be deposited first prior to depositing first electrode layer 1b, without problem. First and second electrode layers 1b and 1c overlap each other in connection holes h1 such that first and second electrode layers 1b and 1c are connected electrically to each other (step (b)). First and second electrode layers 1b and 1c are Ag layers of several hundreds nm in thickness deposited by sputtering. Referring to FIG. 4C, connection holes h1 are bored at the predetermined positions in substrate 1a (step (c)).

Referring to FIG. 4D, a photoelectric converter layer 1d is deposited on first electrode layer 1b such that photoelectric converter layer 1d covers the inner surfaces of connection holes h1 and the inner surfaces of collector holes h2 (step (d)). In the film deposition step (d), the PECVD apparatus (or the plasma control apparatus) prepared as described earlier is used. According to the first embodiment, an a-Si film is deposited for the i-layer.

Prior to forming the non-crystalline photoelectric converter device in practice, a peak-to-peak voltage Vpp is measured at multiple measuring points on high-frequency-wave electrode 210. According to the first embodiment, a potential measurement is performed using an oscilloscope. The conditions for film deposition include the frequency of high-frequency-electric power supply 205 and the film deposition pressure as parameters. The frequency of high-frequency electric power supply 205 is set at 13 MHz or 27 MHz. The film deposition pressure is varied between 40 Pa and 400 Pa. The other film deposition conditions include the hydrogen dilution rate ($H_2/SiH_4$) set at 10 and the electric power density of high-frequency electric power supply 205 set at 60 mW/cm$^2$. FIG. 5 shows the results measured for high-frequency electric power supply 205, the frequency of which is set at 13 MHz. FIG. 6 describes the results measured for high-frequency electric power supply 205, wherein the frequency thereof is set at 27 MHz. In FIGS. 5 and 6, the vertical axis represents the peak-to-peak voltage Vpp (V) and the horizontal axis the film deposition pressure (Pa). In these figures, the black circles represent the results measured at the upper measuring point 221, the hatched triangles the results measured at the lower measuring point 222, the rhombuses the results measured at the left measuring point 223, and the hatched squares the results measured at the right measuring point 224. As one knows from FIGS. 5 and 6, the differences between the absolute value of the peak-to-peak voltage Vpp measured at the lower measuring point 222 and the absolute values of the peak-to-peak voltages Vpp measured at the other three measuring points become wider as the film deposition pressure increases. The peak-to-peak voltage differences for high-frequency electric power supply 205 when the frequency thereof is set at 27 MHz, are wider than the peak-to-peak voltage differences when the frequency is set at 13 MHz. As shown in FIGS. 5 and 6, it is preferable for the peak-to-peak voltages Vpp measured at the respective measuring points to be 300 V or lower.

For depositing the i-layer in the photoelectric converter device, the frequency of high-frequency electric power supply 205 is set at 13 MHz and 27 MHz and the film deposition pressure at 67 Pa, 180 Pa, and 300 Pa, according to the first embodiment. Photoelectric converter devices are fabricated for all the combinations in the matrix of the frequencies of high-frequency electric power supply 205 and the film deposition pressures. The film deposition speeds are calculated using the film thickness calculated optically and the film deposition periods for the a-Si thin films deposited in advance under the i-layer deposition conditions. Eleven measuring points are selected for measuring the film deposition speeds on the diagonal line connecting the lower left corner and the upper right corner of the effective film deposition area. In fabricating single cells, the film deposition period is adjusted based on the measured film deposition speeds so that the designed film thickness may be 300 nm. The i-layer thickness is measured optically again after fabricating the single cells. It is confirmed that the i-layer thickness is around 300 nm.

Referring to FIG. 4E, a transparent electrode layer is deposited on photoelectric converter layer 1d for a third electrode layer 1e. Electrically conductive oxide layers of ITO (indium tin oxide), $SnO_2$, and ZnO are used generally for transparent electrode layer 1e. While depositing transparent electrode layer 1e, connection hole 1h and the vicinity thereof are covered with a mask so that any transparent electrode layer may not be formed in connection hole 1h and the vicinity thereof (step (e)). Referring now to FIG. 4F, a fourth electrode layer 1f formed of a metal film and such an electrically conductive film with low resistance is deposited on the back surface (step (f)). As a result of the step (f), third electrode layer 1e and fourth electrode layer 1f overlap each other in collector holes h2 such that third electrode layer 1e and fourth electrode layer 1f are connected electrically to each other. After the steps (a) through (f) are completed, the laminates on both major surfaces of substrate 1a are cut into predetermined shapes, resulting in a solar cell formed of unit cells $U_n$ connected in multi-series (step (g)). In FIG. 4G, cutting section 1g is shown perpendicularly to the direction in which it extends. As described earlier, unit cells $U_n$ are cut out by cutting sections 1g such that unit cell $U_n$ includes collector holes h2 only, and third electrode layer 1e on unit cell $U_n$ and fourth electrode layer 1f on the back surface are connected to each other only in holes h2. Therefore, back electrodes $E_{n-1, n}$ and $E_{n, n+1}$, adjacent to each other and adjacent to an arbitrary unit cell $U_n$, are connected in series via the unit cell $U_n$ such that the predetermined multiple series connections of unit cell $U_n$ and back electrode E are connected in series. Thus, a solar cell is formed. Then, the step of applying a reverse bias voltage to the formed solar cell and the step of assembling the solar cell biased in reverse into a module are performed and the manufacture of the sample solar cell is completed.

The manufactured sample solar cells are loaded into an artificial light source (solar simulator) radiating light at the light intensity of 100 mW/cm$^2$, and exposed to the irradiated light for 300 hours to measure the cell characteristics deteriorated by the light exposure. Then, the irradiated sample solar cells are taken out of the solar simulator and the IV-characteristics thereof are measured under white light (100 mW/cm$^2$). Temperature correction is performed to correct the measured data to the values at 25° C.

FIG. 7 is a graph showing a set of curves indicating the thickness distributions of the i-layer deposited under different film deposition pressures (at the frequency of high-frequency electric power supply 205 set at 13 MHz). FIG. 8 is a graph showing a set of curves indicating the thickness distributions of the i-layer deposited under different film deposition pressures (at the frequency of high-frequency electric power supply 205 set at 27 MHz). In FIGS. 7 and 8, the horizontal axis represents the 11 measuring points on the diagonal line connecting the lower left corner and the upper right corner of the effective film deposition area. The measuring point 1 corresponds to the lower left corner of the effective film deposition area, the measuring point 6 corresponds to the center of the effective film deposition area, and the measuring point 11 corresponds to the upper right corner of the effective film deposition area. In FIGS. 7 and 8, the vertical axis represents the relative film thickness normalized such that the maximum film thickness at the measuring point 11 is 1. In FIGS. 7 and 8, the black circles represent the relative thickness of film deposited under the film deposition pressure of 67 Pa, the hatched triangles represent the relative thickness of film deposited under the film deposition pressure of 180 Pa, and the rhombuses represent the relative thickness of film deposited under the film deposition pressure of 300 Pa. As shown in FIGS. 7 and 8, the film thickness uniformity becomes worse as the differences between the absolute values of the peak-to-peak voltages Vpp widen. Under the conditions in which the film thickness uniformity is not good, the peak-to-peak voltage Vpp is high in the lower portion of the effective film deposition area, and, in response to this, the relative film thickness is larger in the lower portion of the effective film deposition area than in the upper portion thereof.

FIG. 9 is a graph with two curves showing the characteristics of the solar cells manufactured by the plasma control method according to the first embodiment of the invention. In FIG. 9, the horizontal axis represents the film deposition pressure (Pa) and the vertical axis the relative stabilizing efficiency normalized such that the maximum relative stabilizing efficiency at the measuring point 6 is 1. In FIG. 9, the black circles represent the relative stabilizing efficiencies at the frequency of the high-frequency electric power supply 205 set at 13 MHz and the hatched triangles the relative stabilizing efficiencies at the frequency of the high-frequency electric power supply set at 27 MHz. When the frequency of the high-frequency electric power supply 205 is 13 MHz and 27 MHz, the solar cell manufactured at the film deposition pressure of 180 Pa exhibits the best stabilizing efficiency, presumably because the film thickness uniformity over the entire solar cell is excellent and because the film deposition pressure, at which the peak-to-peak voltage Vpp is low, is selected. At the film deposition pressures of 67 Pa and 180 Pa, the solar cell manufactured at 27 MHz exhibits almost the same or better solar cell characteristics than the solar cell manufactured at 13 MHz, although the film thickness uniformity in the solar cell manufactured at 27 MHz is worse than the film thickness uniformity in the solar cell manufactured at 13 MHz. These results are believed to be obtained because the absolute value of the peak-to-peak voltage Vpp is lower with the frequency of high-frequency electric power supply 205 set at 27 MHz than with the frequency of high-frequency electric power supply 205 set at 13 MHz, and because less film quality deterioration is caused by ion damage at 27 MHz than at 13 MHz. It has been confirmed that the ratio of the amount of hydrogen in the SiH$_2$ bondings to the amount of hydrogen in the SiH bondings (SiH$_2$/SiH) in the i-layer in the solar cells manufactured under these conditions is between 0.1 and 0.3 (preferably 0.3 or smaller). In the solar cells manufactured under the film deposition pressure of 180 Pa, the film deposition rate with the frequency of high-frequency electric power supply 205 set at 27 MHz is 1.5 times as fast as the film deposition rate at 13 MHz. Therefore, it is preferable to select the frequency of high-frequency electric power supply 205 to be 27 MHz rather than 13 MHz according to the first embodiment.

According to the first embodiment of the invention, a thin film silicon solar cell is manufactured by depositing a silicon thin film such as an a-Si thin film and a μc-Si thin film in a PECVD apparatus. In the PECVD apparatus, the electrode size is set at 1 m×1 m, high-frequency electric power supply 205, the frequency of which is set at 13 MHz or 27 MHz, is connected to high-frequency-wave electrode 210, and earth electrode 211 is grounded. High-frequency electric power supply 205 is connected to high-frequency-wave electrode 210 at multiple power supply points intentionally positioned to obtain a uniform potential distribution or a uniform plasma distribution over high-frequency-wave electrode 210. Prior to forming a photoelectric converter device in practice, the peak-to-peak voltage Vpp is measured at multiple measuring points on high-frequency-wave electrode 210. The conditions for film deposition include as parameters the frequency of high-frequency electric power supply 205 and the film deposition pressure. The frequency of high-frequency electric power supply 205 is set at 13 MHz or 27 MHz. The film deposition pressure is varied between 40 Pa and 400 Pa. The other film deposition conditions include the hydrogen dilution rate (H$_2$/SiH$_4$) set at 10, and the electric power density of high-frequency electric power supply 205 set at 60 mW/cm$^2$. It is relatively easy to measure the peak-to-peak voltage Vpp on high-frequency-wave electrode 210. It is possible to measure the peak-to-peak voltage Vpp at multiple measuring points on high-frequency-wave electrode 210 easily at low cost. Since the distribution of the peak-to-peak voltage Vpp exhibits a correlation with the potential distribution on high-frequency-wave electrode 210 and a correlation with the plasma distribution, excellent film thickness uniformity is obtained by monitoring the distribution of the peak-to-peak voltage Vpp on high-frequency-wave electrode 210 and by setting a control step for selecting the film deposition conditions which make the peak-to-peak voltages Vpp at the respective measuring points on high-frequency-wave electrode 210 nearly the same. In other words, a means (guideline) for increasing the film thickness uniformity is obtained by selecting the distribution of the peak-to-peak voltage Vpp on high-frequency-wave electrode 210 for a measurable quantity related with the change in film thickness uniformity caused by the variations in the film deposition conditions, and the film deposition conditions are optimized simply and easily. Since the peak-to-peak voltages Vpp is measured relatively easily on high-frequency-wave electrode 210, the measurement errors are reduced, it is not necessary to employ any large-scale measuring system, and the apparatus costs are reduced. It is possible to prevent the uniformity of thickness in the film plane from being impaired even when the electrode area is widened to be on the level of 1 m×1 m, or even when the power supply frequency is higher. The plasma uniformity is important for etching, since the plasma uniformity affects the etching rate uniformity. Therefore, the plasma control method according to the invention is effective for etching that uses a plasma. In detail, an etching step may be provided to etch substrate 212 positioned on high-frequency-wave electrode 210 or on the earth electrode 211 using an etching gas made to flow from gas feeder line 202 into vacuum chamber 201.

Second Embodiment

Figure 10:
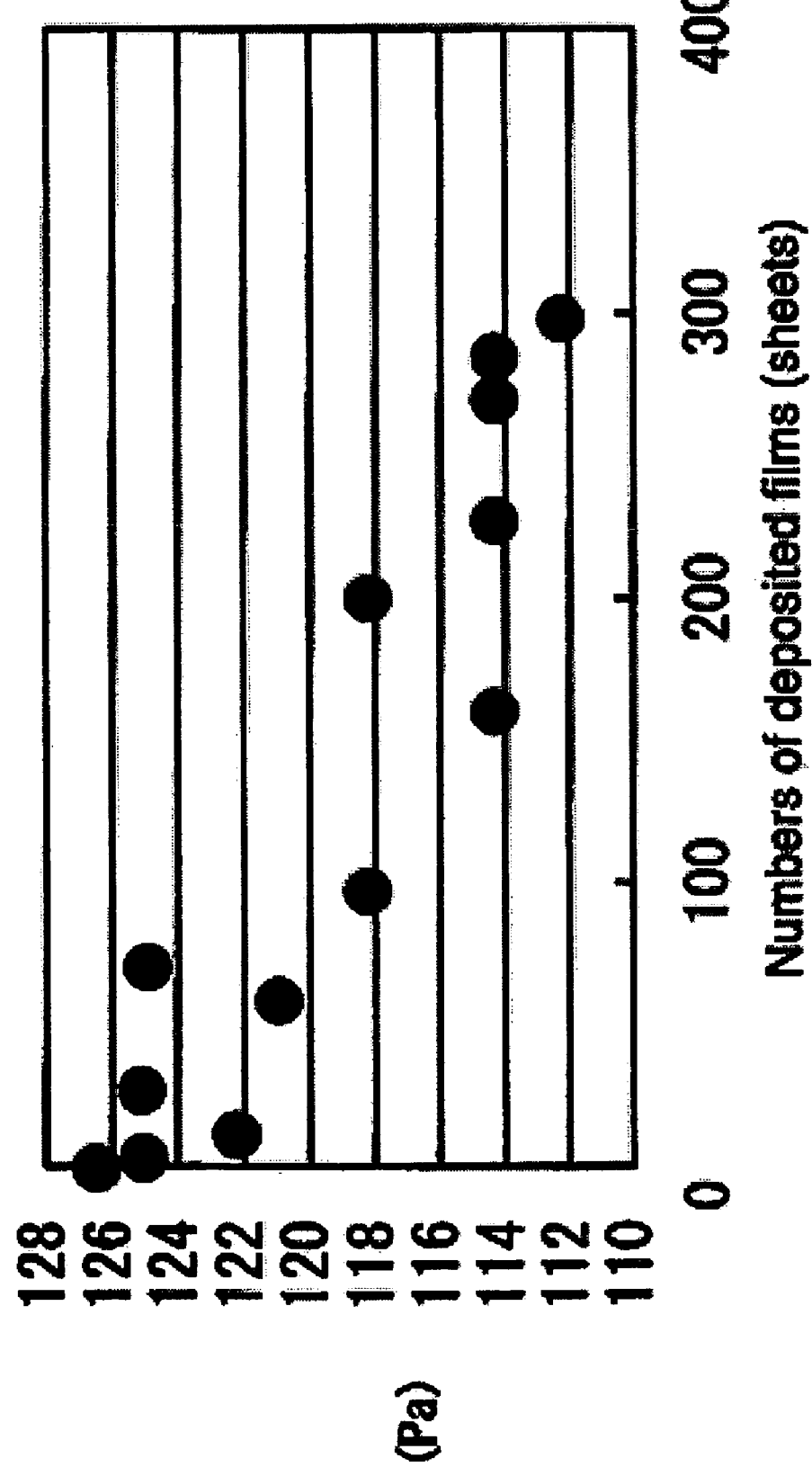
FIG. 10 relates the automatically controlled pressure values with the number of the films deposited.
Figure 11:
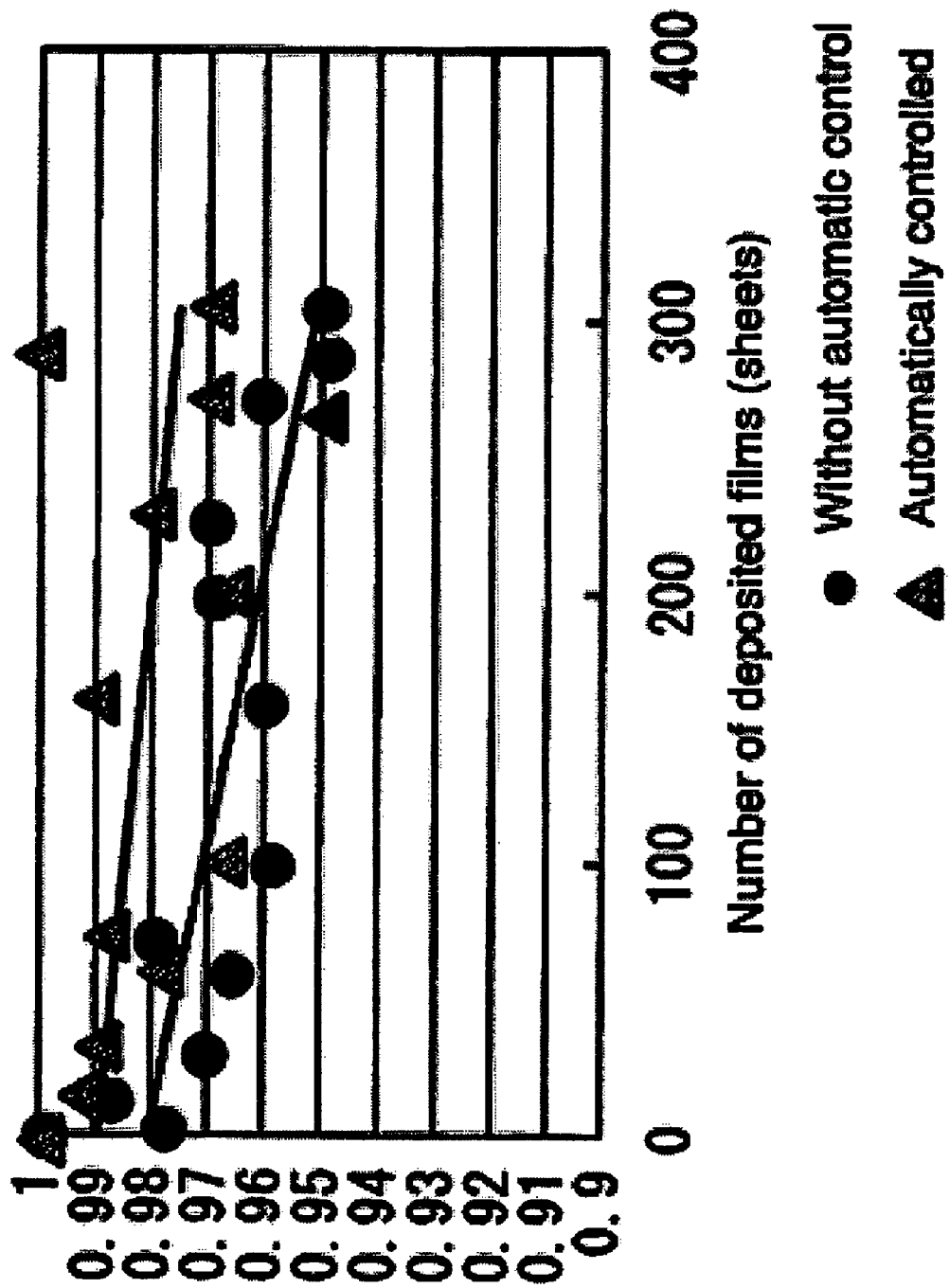
FIG. 11 shows two plots relating the relative stabilizing efficiencies of the solar cells with the number of the films deposited.

According to the second embodiment of the invention, a PECVD apparatus that facilitates the deposition of films by the stepping roll scheme in the same manner as according to the first embodiment is used. According to the second embodiment, the PECVD apparatus includes a control mechanism (automatic control means) that automatically controls, based on the peak-to-peak voltages Vpp measured at the respective measuring points, the film deposition pressure such that the differences between the absolute values of the peak-to-peak voltages Vpp are minimized (such that the peak-to-peak voltages Vpp are nearly the same). In detail, since the peak-to-peak voltage Vpp measured at the lower measuring point is much different from the peak-to-peak voltages Vpp measured at the other measuring points as described in connection with the first embodiment, the film deposition pressure is controlled so that the difference between the peak-to-peak voltage Vpp at the upper measuring point and the peak-to-peak voltage Vpp at the lower measuring point may be minimized. According to the second embodiment, the frequency of high-frequency electric power supply 205 is set at 27 MHz. The other conditions are set to be the same with those according to the first embodiment. In the early stage of film deposition, the film deposition pressure is controlled automatically to be around 120 Pa. As FIG. 6, which illustrates the pressure dependence of the peak-to-peak voltage Vpp indicates, the film deposition pressure of 120 Pa is in the vicinity of the pressure at which the differences between the peak-to-peak voltages Vpp are minimum. Film depositions are performed for 300 cells by the stepping roll scheme. FIG. 10 relates the automatically controlled pressure values with the number of the films deposited. In FIG. 10, the horizontal axis represents the number of films deposited (sheets) and the vertical axis represents the automatically controlled pressure values (Pa). As FIG. 10 shows, the pressure values become lower with increasing numbers of sheets of deposited films. FIG. 11 is a graph with two plots relating the relative stabilizing efficiencies of the solar cells to the number of the films deposited. In FIG. 11, the horizontal axis represents the number of the films deposited (sheets) and the vertical axis represents the stabilizing efficiencies (relative values). In FIG. 11, the black circles represent the results obtained under uncontrolled film deposition pressures and the hatched triangles represent the results obtained under the automatically controlled film deposition pressures. As FIG. 11 shows, the variations between the early stage of lot manufacture and the late stage of lot manufacture are reduced more effectively by the automatic pressure control as compared with lot manufacture under the uncontrolled pressure. This is probably because the film thickness uniformity is increased by optimizing the film deposition pressure as compared with the film thickness uniformity obtained under the uncontrolled film deposition pressures, and because the solar cell characteristics are improved somewhat due to lowering of the absolute values of the peak-to-peak voltages Vpp by from 10 V to 30 V.

As described above, a PECVD apparatus that facilitates depositing films by the stepping roll scheme in the same manner as according to the first embodiment is used according to the second embodiment of the invention. According to the second embodiment, the PECVD apparatus is provided with a control mechanism that automatically controls the film deposition pressure based on the peak-to-peak voltages Vpp measured at the respective measuring points, such that the differences between the absolute values of the peak-to-peak voltages Vpp are minimized. In detail, the film deposition pressure is controlled based on the results of the plasma control according to the first embodiment so that the differences between the peak-to peak voltage Vpp at the upper measuring point and the peak-to-peak voltage Vpp at the lower measuring point may be minimized. According to the second embodiment, the frequency of high-frequency electric power supply 205 is set at 27 MHz and the other conditions are set to be the same as those according to the first embodiment. It has been made clear that the film deposition pressure is controlled automatically in the early stage of the film deposition to be around 120 Pa, at which the differences between the peak-to-peak voltages Vpp are minimum. It also has been made clear that the variations between the early stage of lot manufacture and the late stage of lot manufacture are reduced more by the automatic pressure control as compared with the lot manufacture under the uncontrolled pressure. Thus, by providing the plasma control apparatus according to the first embodiment with an automatic control mechanism that controls the film deposition pressure so that the differences between the absolute values of the peak-to-peak voltages Vpp may be minimized, the plasma control according to the second embodiment facilitates reducing the variations that depend on the time of lot manufacture such as the early stage of lot manufacture and the late stage of lot manufacture, in addition to exhibiting the effects which the plasma control according to the first embodiment exhibits. In other words, an automatic control mechanism, which relates the monitored peak-to-peak voltage values with the other film deposition conditions and controls the other film deposition conditions based on the monitored peak-to-peak voltage values, is provided. The automatic control mechanism facilitates controlling the film deposition conditions in response to the variations caused in the absolute values and the distributions of the peak-to-peak voltages Vpp on the high-frequency-wave electrode. Since the automatic control mechanism facilitates control of the film deposition conditions in response to the variations not only from lot to lot but also in the process of lot manufacture such as the early stage of lot manufacture and the late stage of lot manufacture, solar cells that exhibit excellent characteristics uniformity are manufactured, and the throughput of the solar cell manufacture is improved.

What is claimed is:

1. A plasma control method for controlling distribution of a plasma generated in a vacuum chamber including a first electrode connected to a high-frequency electric power supply and a second electrode facing the first electrode, the second electrode being connected to one of ground potential or a predetermined electric power supply, the plasma being generated by the high-frequency electric power fed to the first electrode, the method comprising the steps of:

measuring peak-to-peak voltages at multiple points on at least one of the first electrode and the second electrode; and controlling distribution of the plasma generated based on the measured peak-to-peak voltages at the multiple points by maintaining the peak-to-peak voltages measured at the multiple points approximately the same so that uniformity is improved.

2. The plasma control method for controlling distribution of a plasma generated in a vacuum chamber having a pressure which is variable and including a first electrode connected to a high-frequency electric power supply and a second electrode facing the first electrode, the second electrode being connected to one of ground potential or a predetermined electric power supply, the plasma being generated by the high-frequency electric power fed to the first electrode, the method comprising the steps of:

measuring peak-to-peak voltages at multiple points on at least one of the first electrode and the second electrode; and controlling the distribution of the plasma generated based on the measured peak-to-peak voltages at the multiple points by maintaining the peak-to-peak voltages measured at the multiple points approximately the same so that uniformity is improved;

wherein controlling distribution of the plasma generated is accomplished by maintaining the peak-to-peak voltages measured at the multiple points to be approximately the same by adjusting the pressure in the vacuum chamber.

3. The plasma control method according to claim 1, wherein controlling distribution of the plasma generated is accomplished by using an automatic control means to maintain the peak-to-peak voltages measured at the multiple points to be approximately the same.

4. The plasma control method according to claim 3, wherein the vacuum chamber has a variable pressure and the automatic control means maintains the peak-to-peak voltages measured at the multiple points to be approximately the same by adjusting the pressure in the vacuum chamber.

5. The plasma control method according to claim 1, further comprising positioning a substrate on one of the first electrode or the second electrode, flowing a film deposition gas onto the substrate in the vacuum chamber under conditions effective to generate a film-forming plasma, and depositing a thin film on the substrate under predetermined film deposition conditions using the film-forming plasma, wherein the distribution of the film-forming plasma is controlled in the step of controlling.

6. The plasma control method according to claim 5, wherein the film being formed is a non-crystalline photoelectric converter layer containing $SiH_2$ and SiH for a solar cell, and wherein the predetermined film deposition conditions provide a ratio of hydrogen in $SiH_2$ bondings to hydrogen in SiH bondings ($SiH_2$/SiH) in the non-crystalline photoelectric converter layer which is selected to be 0.3 or smaller, and the peak-to-peak voltages measured at the multiple points are selected to be 300 V or lower.

7. The plasma control method according to claim 1, further comprising positioning a substrate on one of the first electrode or the second electrode, flowing an etching gas onto the substrate in the vacuum chamber under conditions effective to generate an etching plasma, and etching the substrate using the etching plasma, wherein the distribution of the etching plasma is controlled in the step of controlling.

* * * * *